United States Patent
Nam et al.

(10) Patent No.: US 10,319,946 B2
(45) Date of Patent: *Jun. 11, 2019

(54) ORGANIC LIGHT EMITTING DEVICE ENCAPSULATING COMPOSITION, AND ORGANIC LIGHT EMITTING DEVICE DISPLAY APPARATUS MANUFACTURED USING SAME

(71) Applicant: SAMSUNG SDI CO., LTD., Yongin-si, Gyeonggi-do (KR)

(72) Inventors: Seong Ryong Nam, Uiwang-si (KR); Ji Yeon Lee, Uiwang-si (KR); Kyoung Jin Ha, Uiwang-si (KR); Sung Min Ko, Uiwang-si (KR); Han Sung Yu, Uiwang-si (KR)

(73) Assignee: Samsung SDI Co., Ltd., Yongin-Si, Gyeonggi-do (KR)

(*) Notice: Subject to any disclaimer, the term of this patent is extended or adjusted under 35 U.S.C. 154(b) by 165 days.

This patent is subject to a terminal disclaimer.

(21) Appl. No.: 15/129,924

(22) PCT Filed: Apr. 9, 2015

(86) PCT No.: PCT/KR2015/003581
§ 371 (c)(1),
(2) Date: Sep. 28, 2016

(87) PCT Pub. No.: WO2015/163612
PCT Pub. Date: Oct. 29, 2015

(65) Prior Publication Data
US 2017/0149016 A1    May 25, 2017

(30) Foreign Application Priority Data

Apr. 23, 2014 (KR) .................. 10-2014-0048899
Apr. 8, 2015 (KR) .................. 10-2015-0049888

(51) Int. Cl.
*C08L 33/10* (2006.01)
*H01L 51/00* (2006.01)
(Continued)

(52) U.S. Cl.
CPC .... *H01L 51/5256* (2013.01); *C08F 222/1006* (2013.01); *C08F 230/08* (2013.01); *C08F 2230/085* (2013.01); *C08L 33/10* (2013.01)

(58) Field of Classification Search
CPC .................. C08F 230/08; C08F 222/10; C08F 2222/1013
See application file for complete search history.

(56) References Cited

U.S. PATENT DOCUMENTS 4,743,667 A * 5/1988 Mizutani .............. C08F 230/08
526/245
5,177,168 A * 1/1993 Baron .................... G02B 1/043
526/245
(Continued)

FOREIGN PATENT DOCUMENTS

CN    101747860 A    6/2010
CN    103309162 A    9/2013
(Continued)

OTHER PUBLICATIONS

Chinese Office Action dated Mar. 5, 2019.

Primary Examiner — Rip A Lee
(74) Attorney, Agent, or Firm — Lee & Morse, P.C.

(57) ABSTRACT

A composition for encapsulation of an organic light emitting diode and an organic light emitting diode display manufactured using the same. The composition for encapsulation includes: about 10 wt % to about 70 wt % of (A) a non-silicon-based di(meth)acrylate; about 20 wt % to about 70 wt % of (B) a silicon-based di(meth)acrylate; about 5 wt % to about 40 wt % of (C) a mono(meth)acrylate; and about (Continued)

1 wt % to about 10 wt % of (D) an initiator, wherein the (B) silicon-based di(meth)acrylate is represented by Formula 1.

14 Claims, 1 Drawing Sheet

(51) Int. Cl.
*H01L 51/52* (2006.01)
*C08F 230/08* (2006.01)
*C08F 222/10* (2006.01)

(56) References Cited

U.S. PATENT DOCUMENTS

| | | | | |
|---|---|---|---|---|
| 6,130,980 | A * | 10/2000 | Murphy | C03C 25/106 |
| | | | | 385/114 |
| 9,893,307 | B2 * | 2/2018 | Nam | H01L 51/0094 |
| 2007/0035698 | A1 * | 2/2007 | Jethmalani | A61F 2/1627 |
| | | | | 351/200 |
| 2013/0236681 | A1 | 9/2013 | Lee et al. | |
| 2014/0106111 | A1 * | 4/2014 | Nam | G03F 7/0755 |
| | | | | 428/76 |
| 2017/0176642 | A1 * | 6/2017 | Courtis | G02B 1/043 |
| 2017/0362462 | A1 * | 12/2017 | Lee | C09D 183/06 |

FOREIGN PATENT DOCUMENTS

| | | | | |
|---|---|---|---|---|
| CN | 103724519 A | | 4/2014 | |
| JP | 2009256493 A | | 11/2009 | |
| JP | 2013-076097 A | | 4/2013 | |
| JP | 2013076097 A | * | 4/2013 | ............ C08F 290/14 |
| JP | 2014001341 A | | 1/2014 | |
| KR | 10-2009-0022121 A | | 3/2009 | |
| KR | 10-2011-0020133 A | | 3/2011 | |
| KR | 10-2013-0097489 A | | 9/2013 | |
| KR | 20140004905 A | | 1/2014 | |
| KR | 10-2014-0034822 | * | 3/2014 | ............. C08F 20/10 |
| KR | 20140034882 A | | 3/2014 | |
| KR | 10-2014-0140769 A | | 12/2014 | |
| KR | 10-1633118 B1 | | 6/2016 | |
| WO | WO 2013/165637 A1 | | 11/2013 | |
| WO | WO 2013187577 A1 | | 12/2013 | |

* cited by examiner

ORGANIC LIGHT EMITTING DEVICE ENCAPSULATING COMPOSITION, AND ORGANIC LIGHT EMITTING DEVICE DISPLAY APPARATUS MANUFACTURED USING SAME

CROSS REFERENCE TO RELATED APPLICATIONS

This is the U.S. national phase application based on PCT Application No. PCT/KR2015/003581, filed Apr. 9, 2015, which is based on Korean Patent Application Nos. 10-2014-0048899, filed Apr. 23, 2014, and 10-2015-0049888, filed Apr. 8, 2015, the entire contents of all of which are hereby incorporated by reference.

TECHNICAL FIELD

The present invention relates to a composition for encapsulating an organic light emitting diode device and an organic light emitting diode display using prepared the same.

BACKGROUND ART

An organic light emitting diode display is an emissive type display emitting light through electroluminescence and includes an organic light emitting diode. The organic light emitting diode can suffer from deterioration in luminous properties upon contact with external moisture and/or oxygen. Thus, the organic light emitting diode must be encapsulated with a composition for encapsulation. The organic light emitting diode is encapsulated in a multilayer structure in which an inorganic barrier layer and an organic barrier layer are sequentially formed. Here, the inorganic barrier layer is formed by plasma deposition, which can cause the organic barrier layer to be etched by plasma. When the organic barrier layer is etched, an encapsulation function of the organic barrier layer can be damaged. As a result, the organic light emitting diode can suffer from deterioration in light emitting properties and reliability.

One example of the related art is disclosed in Korean Patent Laid-open Publication No. 2011-0071039.

DISCLOSURE

Technical Problem

It is one aspect of the present invention to provide a composition for encapsulation of an organic light emitting diode, which can realize an organic barrier layer having high plasma resistance to improve reliability of the organic light emitting diode.

It is another aspect of the present invention to provide a composition for encapsulation of an organic light emitting diode, which can realize an organic barrier layer exhibiting high light transmittance and high photocuring rate.

It is a further aspect of the present invention to provide a composition for encapsulation of an organic light emitting diode, which facilitates formation of an organic barrier layer using a method such as deposition, inkjet printing, and the like.

Technical Solution

In accordance with one aspect of the present invention, a composition for encapsulation of an organic light emitting diode may include: about 10% by weight (wt %) to about 70 wt % of (A) a non-silicon-based di(meth)acrylate; about 20 wt % to about 70 wt % of (B) a silicon-based di(meth)acrylate; about 5 wt % to about 40 wt % of (C) a mono (meth)acrylate; and about 1 wt % to about 10 wt % of (D) an initiator, wherein the (B) silicon-based di(meth)acrylate may be represented by Formula 1:

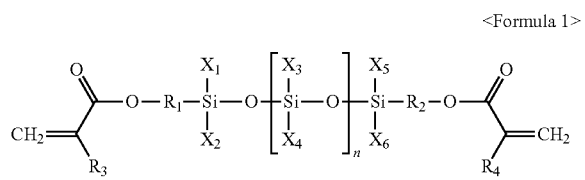

<Formula 1>

(where $R_1$, $R_2$, $R_3$, $R_4$, $X_1$, $X_2$, $X_3$, $X_4$, $X_5$, $X_6$ and n are as described in the following detailed description).

In accordance with another aspect of the present invention, an organic light emitting diode display may include: an organic light emitting diode; and a barrier stack formed on the organic light emitting diode and including an inorganic barrier layer and an organic barrier layer, wherein the organic barrier layer may be formed of the composition for encapsulation of an organic light emitting diode according to the present invention.

Advantageous Effects

The present invention provides a composition for encapsulation of an organic light emitting diode which can realize the organic barrier layer exhibiting plasma resistance. Thus, the organic light emitting diode exhibits improved reliability.

The present invention provides a composition for encapsulation of an organic light emitting diode which exhibits high photocuring rate. Thus, the organic barrier layer exhibits improved light transmittance.

In addition, the present invention provides a composition for encapsulation of an organic light emitting diode which facilitates formation of the organic barrier layer using a method such as deposition, inkjet printing and the like.

BEST MODE

Figure 1:
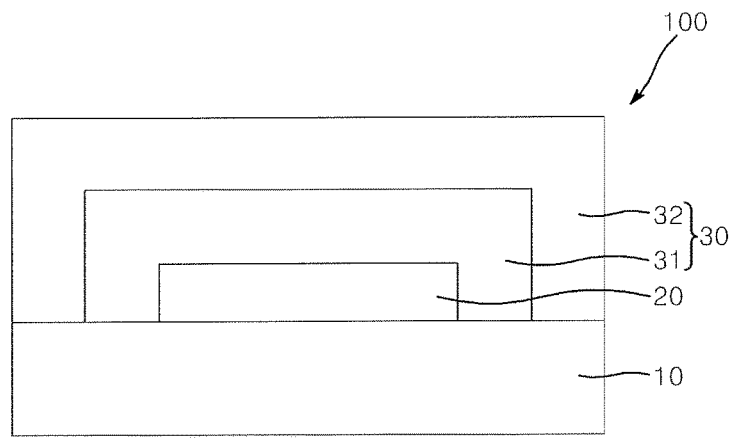
FIG. 1 is a sectional view of an organic light emitting diode display according to one embodiment of the present invention.

Embodiments of the present invention will be described in detail with reference to the accompanying drawings. It should be understood that the present invention is not limited to the following embodiments and may be embodied in different ways. In the drawings, portions irrelevant to the description will be omitted for clarity. Like components will be denoted by like reference numerals throughout the specification.

As used herein, the term "(meth)acryl" refers to acryl and/or methacryl.

Unless otherwise stated, the term "substituted" as used herein means that at least one hydrogen atom among functional groups is substituted with a halogen (for example, F, Cl, Br or I), a hydroxyl group, a nitro group, a cyano group, an imino group (=NH, =NR, wherein R is a $C_1$ to $C_{10}$ alkyl group), an amino group [—$NH_2$, —NH(R'), —N(R")(R"')], wherein R', R" and R'" are each independently a $C_1$ to $C_{10}$ alkyl group], an amidino group, a hydrazine group, a hydrazone group, a carboxylic acid group, a $C_1$ to $C_{20}$ alkyl group, a $C_6$ to $C_{30}$ aryl group, a $C_3$ to $C_{30}$ cycloalkyl group, a $C_3$ to $C_{30}$ heteroaryl group, or a $C_2$ to $C_{30}$ heterocycloalkyl group.

As used herein, the term "aryl group" refers to a functional group in which all elements of a cyclic substituent have p-orbitals and these p-orbitals form a conjugation. The aryl group includes monocyclic, non-fused polycyclic and fused polycyclic functional groups. Here, the term "fused" means that a pair of carbon atoms is shared by contiguous rings. The aryl group also includes biphenyl groups, terphenyl groups, quaterphenyl groups and the like, in which at least two aryl groups are connected to each other through a sigma bond. The aryl group may refer to a phenyl group, a naphthyl group, an anthracenyl group, a phenanthrenyl group, a pyrenyl group, a chrysenyl group, and the like.

As used herein, the term "heteroaryl group" refers to a functional group in which an aryl group contains 1 to 3 hetero atoms selected from the group consisting of N, O, S, P and Si, and the other atoms in the aryl group are carbon. The heteroaryl group also includes groups in which at least two heteroaryl groups are directly connected through a sigma bond. The heteroaryl group also includes groups in which at least two heteroaryl groups are fused with each other. If the heteroaryl groups are fused, each ring may include 1 to 3 heteroatoms as set forth above. The heteroaryl group may refer to, for example, a pyridinyl group, a pyrimidinyl group, a pyrazinyl group, a pyridazinyl group, a triazinyl group, a quinolinyl group, an isoquinolinyl group, and the like.

More specifically, the $C_6$ to $C_{30}$ aryl group and/or the $C_3$ to $C_{30}$ heteroaryl group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted phenylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzothiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, or combinations thereof, without being limited thereto.

As used herein, the term "composition for encapsulation of an organic light emitting diode" may be shortened to "composition for encapsulation".

As used herein, the term "etch rate of an organic barrier layer due to plasma" and the term "plasma etching rate" refer to a value calculated by Equation 2 after the following procedures: an initial height (T1, unit: μm) of an organic barrier layer, which is formed by depositing a composition for encapsulation of an organic light emitting diode to a predetermined thickness and photocuring the composition, is measured, followed by measuring a height (T2, unit: μm) of the organic barrier layer after plasma treatment under conditions of inductively coupled plasma (ICP) power: 2500 W, radio frequency (RF) power: 300 W, DC bias: 200 V, Ar flow: 50 sccm, etching time: 1 min and pressure: 10 mtorr. Here, the initial height (T1) of the organic barrier layer may range from about 1 μm to about 10 μm. The value calculated by Equation 2 can be evaluated plasma resistance of the organic barrier layer. The low value of Equation 2 means excellent plasma resistance of the organic barrier layer.

Plasma etching rate of organic barrier layer (%)=
$\{(T1-T2)/T1\} \times 100$             <Equation 2>

Hereinafter, a composition for encapsulation of an organic light emitting diode according to one embodiment of the present invention will be described in detail.

According to one embodiment of the invention, a composition for encapsulation of an organic light emitting diode may include: about 10 wt % to about 70 wt % of (A) a non-silicon-based di(meth)acrylate; about 20 wt % to about 70 wt % of (B) a silicon-based di(meth)acrylate; about 5 wt % to about 40 wt % of (C) a mono(meth)acrylate; and about 1 wt % to about 10 wt % of (D) an initiator, wherein the (B) silicon-based di(meth)acrylate may be represented by Formula 1:

<Formula 1>

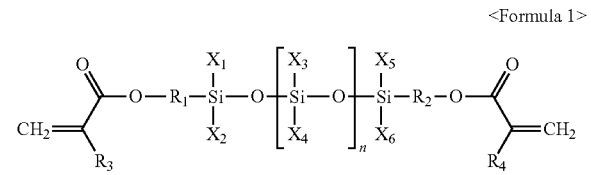

(where $R_1$, $R_2$, $R_3$, $R_4$, $X_1$, $X_2$, $X_3$, $X_4$, $X_5$, $X_6$ and n will be described below).

According to the embodiment of the invention, the composition for encapsulation may include the (A) non-silicon-based di(meth)acrylate, the (B) silicon-based di(meth)acrylate represented by Formula 1, the (C) mono(meth)acrylate, and the (D) initiator. In addition, the composition for encapsulation according to the embodiment includes the (A) non-silicon-based di(meth)acrylate, the (B) silicon-based di(meth)acrylate represented by Formula 1, the (C) mono (meth)acrylate, and the (D) initiator in the specific amounts as set forth above, respectively. Thus, the composition for encapsulation according to the embodiment can exhibit significantly improved photocuring rate. Further, the composition for encapsulation according to the embodiment can realize an organic barrier layer exhibiting excellent light transmittance after curing and exhibiting significantly high plasma resistance. Thus, the composition for encapsulation according to the embodiment can realize the organic barrier layer having low etch rate due to plasma used in formation of an inorganic barrier layer and can improve reliability of an organic light emitting diode as a result.

Specifically, the composition for encapsulation of an organic light emitting diode according to the embodiment may have a photocuring rate of about 88% or more, for example, about 88% to about 99%. In addition, the composition for encapsulation of an organic light emitting diode according to the embodiment have a light transmittance after curing of about 93% or more, for example, about 93.5% to about 100%, at a wavelength of 380 nm to 700 nm. Further, the composition for encapsulation according to the embodiment may have a plasma etching rate after curing of the organic barrier layer of about 20% or less, for example, about 17% or less, for example, about 0.1% to about 20%. Within these ranges of photocuring rate, light transmittance and plasma etching rate of the organic barrier layer, the composition for encapsulation according to the embodiment can significantly improve reliability of the organic light emitting diode.

In one embodiment, the composition for encapsulation of an organic light emitting diode may include about 10 wt % to about 50 wt % of the (A) non-silicon-based di(meth)acrylate, about 20 wt % to about 70 wt % of the (B) silicon-based di(meth)acrylate, about 5 wt % to about 40 wt % of the (C) mono(meth)acrylate, and about 1 wt % to about 10 wt % of the (D) initiator, based on the total weight of (A), (B), (C) and (D).

As used herein, the (A) non-silicon-based di(meth)acrylate, the (B) silicon-based di(meth)acrylate, the (C) mono(meth)acrylate and the (D) initiator are different compounds.

Hereinafter, the (A) non-silicon-based di(meth)acrylate, the (B) silicon-based di(meth)acrylate, the (C) mono(meth)acrylate and the (D) initiator will be described in more detail.

(A) Non-Silicon-Based Di(meth)acrylate

The (A) non-silicon-based di(meth)acrylate is a photocurable monomer which does not include silicon (Si) but, has two (meth)acrylate groups. Thus, the composition for encapsulation can have improved photocuring rate and improved light transmittance after curing. In addition, the (A) non-silicon-based di(meth)acrylate has low viscosity at 25° C. and thus can reduce viscosity of the composition for encapsulation. Thus, the composition for encapsulation can facilitate formation of the organic barrier layer on the organic light emitting diode or on the inorganic barrier layer encapsulating the organic light emitting diode using a method such as inkjet printing and the like.

The (A) non-silicon-based di(meth)acrylate is a non-aromatic non-silicon-based di(meth)acrylate not containing an aromatic group, and may include a substituted or unsubstituted long-chain alkylene group-containing non-silicon-based di(meth)acrylate. In this case, the composition for encapsulation facilitates formation of the organic barrier layer on the organic light emitting diode or on the inorganic barrier layer encapsulating the organic light emitting diode using a method such as deposition and the like.

Specifically, the (A) non-silicon-based di(meth)acrylate may be a substituted or unsubstituted $C_1$ to $C_{20}$ alkylene group-containing di(meth)acrylate. More specifically, the (A) non-silicon-based di(meth)acrylate may include a di(meth)acrylate having an unsubstituted $C_1$ to $C_{15}$ alkylene group between (meth)acrylate groups. Here, the number of carbon atoms of the alkylene group refers to the number of carbon atoms present only in the alkylene group excluding carbon atoms present in the di(meth)acrylate group.

In one embodiment, the (A) non-silicon-based di(meth)acrylate may be represented by Formula 2:

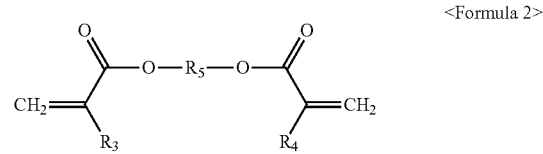

<Formula 2>

(where $R_3$ and $R_4$ are each independently hydrogen or a methyl group; and $R_5$ is a substituted or unsubstituted $C_1$ to $C_{20}$ alkylene group).

Since the composition for encapsulation of an organic light emitting diode according to the present invention includes the (A) non-silicon-based di(meth)acrylate represented by Formula 2, the composition can exhibit higher photocuring rate and allows more easy deposition due to low viscosity thereof.

For example, $R_5$ in Formula 2 may be an unsubstituted $C_8$ to $C_{12}$ alkylene group. More specifically, the (A) non-silicon-based di(meth)acrylate may include at least one of octanediol di(meth)acrylate, nonanediol di(meth)acrylate, decanediol di(meth)acrylate, undecanediol di(meth)acrylate, and dodecanediol di(meth)acrylate.

The (A) non-silicon-based di(meth)acrylates may be used alone or in combination thereof in the composition for encapsulation.

The (A) non-silicon-based di(meth)acrylate may be present in an amount of about 10 wt % to about 70 wt % based on the total weight of (A), (B), (C) and (D). For example, the (A) non-silicon-based di(meth)acrylate may be present in an amount of about 10 wt % to about 50 wt % or about 35 wt % to about 48 wt % based on the total weight of (A), (B), (C) and (D). Within this range, the composition for encapsulation can exhibit improved photocuring rate, and can realize an organic barrier layer exhibiting high light transmittance and low plasma etching rate.

(B) Silicon-Based Di(meth)acrylate

The (B) silicon-based di(meth)acrylate includes at least one substituted or unsubstituted $C_6$ to $C_{30}$ aryl group or substituted or unsubstituted $C_2$ to $C_{30}$ heteroaryl group, which is connected to a silicon atom. Thus, the composition for encapsulation can realize an organic barrier layer having very high plasma resistance and thus exhibiting low plasma etching rate.

The (B) silicon-based di(meth)acrylate may be represented by Formula 1:

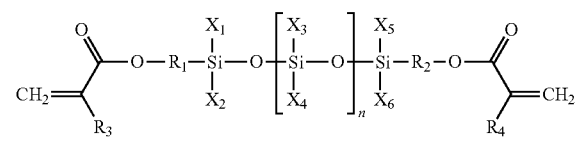

(wherein $R_1$ and $R_2$ are each independently a single bond, a substituted or unsubstituted $C_1$ to $C_{20}$ alkylene group, a substituted or unsubstituted $C_1$ to $C_{30}$ alkylene ether group, *—N(R')—(R")—* (* represents a binding site for an element, R' is hydrogen or a substituted or unsubstituted $C_1$ to $C_{30}$ alkyl group, and R" is a substituted or unsubstituted $C_1$ to $C_{20}$ alkylene group), a substituted or unsubstituted $C_6$ to $C_{30}$ arylene group, a substituted or unsubstituted $C_7$ to $C_{30}$ arylalkylene group, or *—(R')—O—** (here, * represents a binding site for O in Formula 1, ** represents a binding site for Si in Formula 1, and R' is a substituted or unsubstituted $C_1$ to $C_{30}$ alkylene group;

$X_1$, $X_2$, $X_3$, $X_4$, $X_5$ and $X_6$ are each independently hydrogen, a hydroxyl group, a halogen, a cyano group, a substituted or unsubstituted $C_1$ to $C_{30}$ alkyl group, a substituted or unsubstituted $C_1$ to $C_{30}$ heterocycloalkyl group, a substituted or unsubstituted $C_3$ to $C_{30}$ cycloalkyl group, a substituted or unsubstituted $C_1$ to $C_{30}$ alkyl ether group, *—N(R')—(R")—* (* represents a binding site for an element, and R' and R" are each independently hydrogen or a substituted or unsubstituted $C_1$ to $C_{30}$ alkyl group), a substituted or unsubstituted $C_1$ to $C_{30}$ alkyl sulfide group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group;

at least one of $X_1$, $X_2$, $X_3$, $X_4$, $X_5$ and $X_6$ is a substituted or unsubstituted $C_6$ to $C_{30}$ aryl group, or a substituted or unsubstituted $C_2$ to $C_{30}$ heteroaryl group;

$R_3$ and $R_4$ are each independently hydrogen or a methyl group; and n is an integer from 0 to 30, or ranges on average from 0 to 30.)

The term "single bond" means that Si and O are directly connected (Si—O).

Specifically, $R_1$ and $R_2$ may be independently a single bond, a substituted or unsubstituted $C_1$ to $C_{20}$ alkylene group, or a substituted or unsubstituted $C_1$ to $C_{30}$ alkylene ether group. Specifically, $X_1$, $X_2$, $X_3$, $X_4$, $X_5$ and $X_6$ may be each independently hydrogen, a substituted or unsubstituted $C_1$ to $C_{30}$ alkyl group, a substituted or unsubstituted $C_3$ to $C_{30}$ cycloalkyl group, a substituted or unsubstituted $C_1$ to $C_{30}$ alkyl ether group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group; and at least one of $X_1$, $X_2$, $X_3$, $X_4$, $X_5$ and $X_6$ may be a substituted or unsubstituted $C_6$ to $C_{30}$ aryl group.

More specifically, $R_1$ and $R_2$ may be independently a single bond, or a substituted or unsubstituted $C_1$ to $C_{20}$ alkylene group. In this case, the composition for encapsulation can exhibit further reduced plasma etching rate.

More specifically, $X_1$, $X_2$, $X_3$, $X_4$, $X_5$ and $X_6$ may be each independently a substituted or unsubstituted $C_1$ to $C_{10}$ alkyl group, or a substituted or unsubstituted $C_6$ to $C_{10}$ aryl group; and at least one of $X_1$, $X_2$, $X_3$, $X_4$, $X_5$ and $X_6$ may be a or unsubstituted $C_6$ to $C_{10}$ aryl group. More specifically, $X_1$, $X_2$, $X_3$, $X_4$, $X_5$ and $X_6$ may be each independently a methyl, ethyl, propyl, butyl, pentyl, phenyl, biphenyl, or naphthyl group; one, two, three or six of $X_1$, $X_2$, $X_3$, $X_4$, $X_5$ and $X_6$ may be a phenyl or naphthyl group. In this case, the composition for encapsulation can exhibit further reduced plasma etching rate.

More specifically, n is an integer from 1 to 5. In this case, the composition for encapsulation can exhibit further reduced plasma etching rate.

More specifically, the (B) silicon-based di(meth)acrylate may be represented by any one of Formulae 3 to 8.

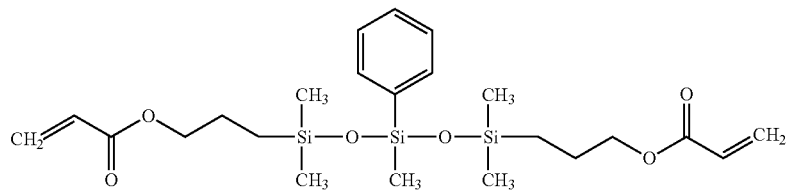

<Formula 3>

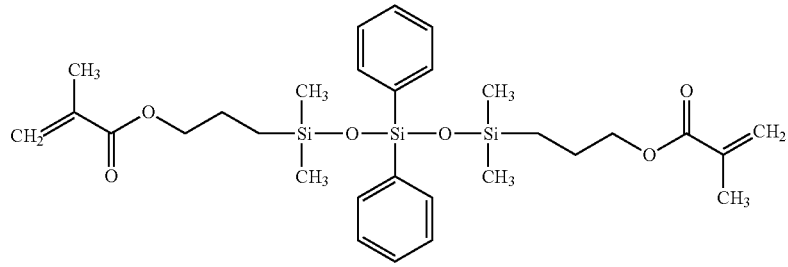

<Formula 4>

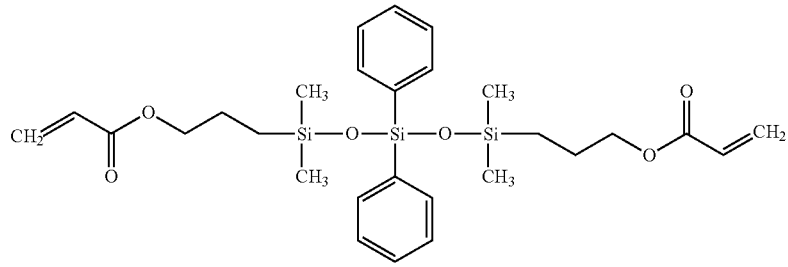

<Formula 5>

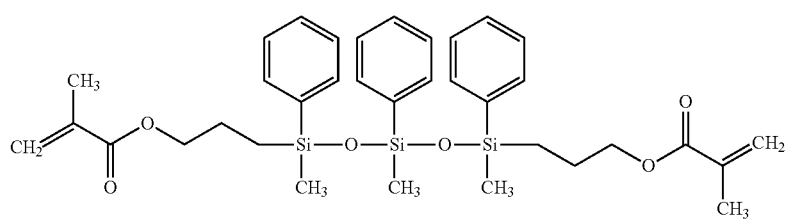

<Formula 6>

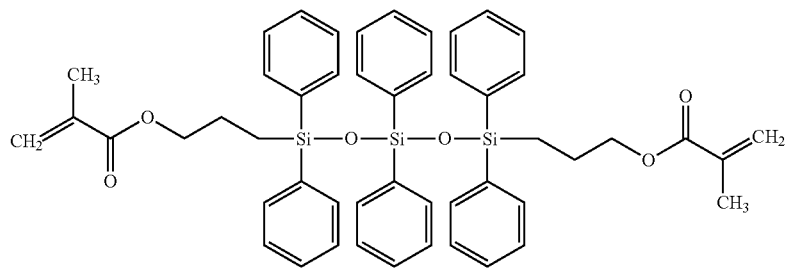

<Formula 7>

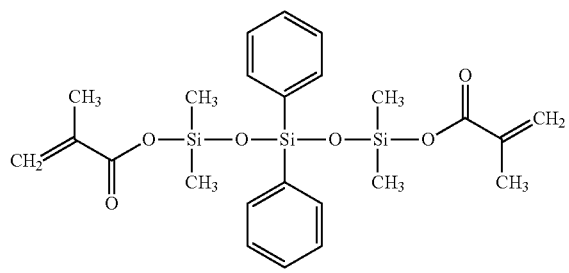

<Formula 8>

The (B) silicon-based di(meth)acrylates may be used alone or in combination thereof.

The (B) silicon-based di(meth)acrylate may be present in an amount of about 20 wt % to about 70 wt % based on the total weight of (A), (B), (C) and (D). For example, the (B) silicon-based di(meth)acrylate may be present in an amount of about 25 wt % to about 45 wt % based on the total weight of (A), (B), (C) and (D). Within this range, the composition for encapsulation can exhibit high photocuring rate. In addition, within this range, the organic barrier layer can exhibit high light transmittance and low plasma etching rate.

The (A) non-silicon-based di(meth)acrylate and the (B) silicon-based di(meth)acrylate may be present in a total amount of about 50 wt % to about 90 wt %, specifically about 60 wt % to about 90 wt % based on the total weight of (A), (B), (C) and (D). Within this range, the composition for encapsulation can realize an organic barrier layer exhibiting low plasma etching rate.

The (B) silicon-based di(meth)acrylate may be prepared by a typical method. For example, the (B) silicon-based di(meth)acrylate may be prepared by reacting a siloxane compound, in which a substituted or unsubstituted $C_6$ to $C_{30}$ aryl group or a substituted or unsubstituted $C_2$ to $C_{30}$ heteroaryl group is connected to at least one silicon atom, with a compound extending a carbon chain (for example, allyl alcohol), followed by reaction with (meth)acryloyl chloride, without being limited thereto. Alternatively, the (B) silicon-based di(meth)acrylate may be prepared by reacting a siloxane compound, in which a substituted or unsubstituted $C_6$ to $C_{30}$ aryl group or a substituted or unsubstituted $C_2$ to $C_{30}$ heteroaryl group is connected to at least one silicon atom, with (meth)acryloyl chloride, without being limited thereto.

(C) Mono(meth)acrylate

The (C) mono(meth)acrylate is included in the composition for encapsulation of an organic light emitting diode and can increase a photocuring rate of the composition for encapsulation. In addition, the (C) mono(meth)acrylate can reduce a plasma etching rate of the organic barrier layer while increasing light transmittance of the organic barrier layer.

The (C) mono(meth)acrylate may include a non-silicon-based mono(meth)acrylate not containing silicon.

The (C) mono(meth)acrylate may include at least one of aromatic mono(meth)acrylates containing an aromatic group and non-aromatic mono(meth)acrylates not containing an aromatic group.

The (C) mono(meth)acrylates may be used alone or in combination thereof. The aromatic mono(meth)acrylates among the (C) mono(meth)acrylates may be used alone or in combination thereof. The non-aromatic mono(meth)acrylates among the (C) mono(meth)acrylates may be used alone or in combination thereof.

In one embodiment, the (C) mono(meth)acrylate may include an aromatic group-containing mono(meth)acrylate. Since both the aromatic group-containing mono(meth)acrylate and the (B) silicon-based di(meth)acrylate as set forth above contain an aromatic group, the aromatic group-containing mono(meth)acrylate and the (B) silicon-based di(meth)acrylate exhibit further improved compatibility in the composition for encapsulation of an organic light emitting diode when used together. Thus, the (C) mono(meth) acrylate can exhibit further improved miscibility with the (B) silicon-based di(meth)acrylate. In this case, the composition for encapsulation can have an improved effect of reducing a plasma etching rate of the organic barrier layer.

The aromatic mono(meth)acrylate may include a substituted or unsubstituted aromatic group-containing mono(meth)acrylate. Here, the term "aromatic group" refers to a polycyclic aromatic group including monocyclic, fused forms and the like, or refers to a form in which single rings are connected to each other by a sigma bond. For example, the aromatic group may refer to at least one of a substituted or unsubstituted $C_6$ to $C_{50}$ aryl group, a substituted or unsubstituted $C_7$ to $C_{50}$ arylalkyl group, a substituted or unsubstituted $C_3$ to $C_{50}$ heteroaryl group, and a substituted or unsubstituted $C_3$ to $C_{50}$ heteroarylalkyl group. More specifically, the aromatic group may include at least one of phenyl, biphenyl, terphenyl, quaterphenyl, naphthyl, anthracenyl, phenanthrenyl, chrysenyl, triphenylenyl, tetracenyl, pyrenyl, benzopyrenyl, pentacenyl, coronenyl, ovalenyl, corannulenyl, benzyl, pyridinyl, pyrazinyl, pyrimidinyl, pyridazinyl, triazinyl, quinolinyl, isoquinolinyl, quinoxalinyl, acridinyl, quinazolinyl, cinnolinyl, phthalazinyl, thiazolyl, benzothiazolyl, isoxazolyl, benzisoxazolyl, oxazolyl, benzoxazolyl, pyrazolyl, indazolyl, imidazolyl, benzimidazolyl, purinyl, thiophenyl, benzothiophenyl, furanyl, benzofuranyl, and isobenzofuranyl groups.

For example, the aromatic mono(meth)acrylate may be represented by Formula 9:

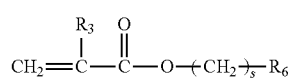

<Formula 9>

(where $R_3$ is hydrogen or a methyl group; s is an integer from 0 to 10; and $R_6$ is a substituted or unsubstituted $C_6$ to $C_{50}$ aryl group or a substituted or unsubstituted $C_6$ to $C_{50}$ aryloxy group).

For example, $R_6$ may be a phenylphenoxyethyl, phenoxyethyl, benzyl, phenyl, phenylphenoxy, phenoxy, phenylethyl, phenylpropyl, phenylbutyl, methylphenylethyl, propylphenylethyl, methoxyphenylethyl, cyclohexylphenylethyl, chlorophenylethyl, bromophenylethyl, methylphenyl, methylethylphenyl, methoxyphenyl, propylphenyl, cyclohexylphenyl, chlorophenyl, bromophenyl, phenylphenyl, biphenyl, terphenyl, quaterphenyl, anthracenyl, naphthalenyl, triphenylenyl, methylphenoxy, ethylphenoxy, methylethylphenoxy, methoxyphenyloxy, propylphenoxy, cyclohexylphenoxy, chlorophenoxy, bromophenoxy, biphenyloxy, terphenyloxy, quaterphenyloxy, anthracenyloxy, naphthalenyloxy, or triphenylenyloxy group.

Specifically, the aromatic mono(meth)acrylate may include at least one of 2-phenylphenoxyethyl (meth)acrylate, phenoxyethyl (meth)acrylate, phenyl (meth)acrylate, phenoxy (meth)acrylate, 2-ethylphenoxy (meth)acrylate, benzyl (meth)acrylate, 2-phenylethyl (meth)acrylate, 3-phenylpropyl (meth)acrylate, 4-phenylbutyl (meth)acrylate, 2-(2-methylphenyl)ethyl (meth)acrylate, 2-(3-methylphenyl)ethyl (meth)acrylate, 2-(4-methylphenyl)ethyl (meth)acrylate, 2-(4-propylphenyl)ethyl (meth)acrylate, 2-(4-(1-methylethyl)phenyl)ethyl (meth)acrylate, 2-(4-methoxyphenyl)ethyl (meth)acrylate, 2-(4-cyclohexylphenyl)ethyl (meth)acrylate, 2-(2-chlorophenyl)ethyl (meth)acrylate, 2-(3-chlorophenyl)ethyl (meth)acrylate, 2-(4-chlorophenyl)ethyl (meth)acrylate, 2-(4-bromophenyl)ethyl (meth)acrylate, 2-(3-phenylphenyl)ethyl (meth)acrylate, 4-(biphenyl-2-yloxy)butyl (meth)acrylate, 3-(biphenyl-2-yloxy)butyl (meth)acrylate, 2-(biphenyl-2-yloxy)butyl (meth)acrylate, 1-(biphenyl-2-yloxy)butyl (meth)acrylate, 4-(biphenyl-2-yloxy)propyl (meth)acrylate, 3-(biphenyl-2-yloxy)propyl (meth)acrylate, 2-(biphenyl-2-yloxy)propyl (meth)acrylate, 1-(biphenyl-2-yloxy)propyl (meth)acrylate, 4-(biphenyl-2-yloxy)ethyl (meth)acrylate, 3-(biphenyl-2-yloxy)ethyl (meth)acrylate, 2-(biphenyl-2-yloxy)ethyl (meth)acrylate, 1-(biphenyl-2-yloxy)ethyl (meth)acrylate, 2-(4-benzylphenyl)ethyl (meth)acrylate, 1-(4-benzylphenyl)ethyl (meth)acrylate, and structural isomers thereof, without being limited thereto. In addition, it should be understood that the (meth)acrylates as set forth herein are provided only by way of example and the present invention is not limited thereto. Further, the (meth)acrylates according to the present invention include all acrylates corresponding to structural isomers. For example, although only 2-phenylethyl (meth)acrylate is set forth by way of example, all of 3-phenylethyl (meth)acrylate and 4-phenyl (meth)acrylate are included in the present invention.

The non-aromatic mono(meth)acrylate may be a substituted or unsubstituted $C_1$ to $C_{20}$ alkyl group-containing mono(meth)acrylate. Specifically, the non-aromatic mono(meth)acrylate may be an unsubstituted linear $C_1$ to $C_{20}$ alkyl group-containing mono(meth)acrylate, more specifically an unsubstituted linear $C_{10}$ to $C_{20}$ alkyl group-containing mono(meth)acrylate. For example, the non-aromatic mono(meth)acrylate may include at least one of decyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, and arachidyl (meth)acrylate, without being limited thereto.

The (C) mono(meth)acrylate may be present in an amount of about 5 wt % to about 40 wt % based on the total weight of (A), (B), (C) and (D). For example, the (C) mono(meth) acrylate may be present in an amount of about 5 wt % to about 30 wt % based on the total weight of (A), (B), (C) and (D). Within this range, the composition for encapsulation can exhibit high photocuring rate. In addition, the organic barrier layer can exhibit high light transmittance and low plasma etching rate.

(D) Initiator

The (D) initiator allows the organic barrier layer to be formed by curing the (A) non-silicon-based di(meth)acrylate, the (B) silicon-based di(meth)acrylate and the (C) mono(meth)acrylate, and may include any typical photopolymerization initiators without limitation.

The (D) initiator may include at least one of triazine, acetophenone, benzophenone, thioxanthone, benzoin, phosphorus, and oxime initiators, without being limited thereto. For example, the phosphorus initiator may include diphenyl (2,4,6-trimethylbenzoyl)phosphine oxide, benzyl(diphenyl) phosphine oxide, bis(2,6-dimethoxybenzoyl)(2,4,4-trimethylpentyl)phosphine oxide, and mixtures thereof. For example, the phosphorus initiator can exhibit better initiation performance under UV light of long wavelengths in the composition according to the present invention.

The (D) initiators may be used alone or in combination thereof.

The (D) initiator may be present in an amount of about 1 wt % to about 10 wt % based on the total weight of (A), (B), (C) and (D). Within this range, the composition for encapsulation allows sufficient photopolymerization under exposure to light. In addition, the unreacted initiator remaining after photopolymerization can be reduced, whereby the organic barrier layer can exhibit further improved light transmittance. Specifically, the (D) initiator may be present in an amount of about 2 wt % to about 5 wt % based on the total weight of (A), (B), (C) and (D).

The composition for encapsulation of an organic light emitting diode may be formed by mixing the (A) non-silicon-based di(meth)acrylate, the (B) silicon-based di(meth)acrylate, the (C) mono(meth)acrylate and the (D) initiator. For example, the composition for encapsulation of an organic light emitting diode may be formed as a solvent-free composition not containing a solvent. For example, when the composition for encapsulation of an organic light emitting diode is a solvent-free composition, wt % is based on the total weight of the (A) non-silicon-based di(meth)acrylate, the (B) silicon-based di(meth)acrylate, the (C) mono (meth)acrylate and the (D) initiator.

The composition for encapsulation of an organic light emitting diode may include about 10 wt % to about 50 wt % of Si. Within this range, the composition for encapsulation can further reduce the plasma etching rate of the organic barrier layer.

The composition for encapsulation of an organic light emitting diode may have a viscosity at 25° C.±2° C. (23° C. to 27° C.) of about 0 cPs to about 200 cPs, specifically about 100 cPs or less, more specifically about 5 cPs to about 50 cPs, about 5 cPs to about 40 cPs, or about 5 cPs to about 30 cPs. Within this range, the composition for encapsulation of an organic light emitting diode can facilitate formation of the organic barrier layer. Within this range, it is advantageous to perform a method such as deposition and inkjet printing upon formation of the organic barrier layer.

The composition for encapsulation of an organic light emitting diode is a photocurable composition, and may be cured by UV irradiation at about 10 mW/cm$^2$ to about 500 mW/cm$^2$ for about 1 second to about 100 seconds, without being limited thereto.

The composition for encapsulation of an organic light emitting diode may be used in encapsulating an organic light emitting diode. Specifically, the composition may form an organic barrier layer in an encapsulation structure in which an inorganic barrier layer and an organic barrier layer are sequentially formed. For example, the composition for encapsulation may form the organic barrier layer using a method such as deposition and inkjet printing, without being limited thereto.

The composition for encapsulation of an organic light emitting diode may also be used for encapsulation of a member for apparatuses, particularly a member for displays, which can suffer from degradation or deterioration in quality due to permeation of gas or liquid in a surrounding environment, for example, chemicals used upon processing of electronics as well as atmospheric oxygen and/or moisture and/or water vapor. For example, the composition for encapsulation may also be used in an encapsulation structure of a member for apparatuses, such as illumination devices, metal sensor pads, microdisc lasers, electrochromic devices, photochromic devices, microelectromechanical systems, solar cells, integrated circuits, charge-coupled devices, luminescent polymers, and light emitting diodes, without being limited thereto.

Hereinafter, a composition for encapsulation of an organic light emitting diode according to another embodiment of the present invention will be described in detail.

According to another embodiment of the present invention, a composition for encapsulation of an organic light emitting diode may include (A) a non-silicon-based di(meth) acrylate. (B) a silicon-based di(meth)acrylate, (C) a mono (meth)acrylate, (D) an initiator and (E) a heat stabilizer, wherein the (B) silicon-based di(meth)acrylate may be represented by Formula 1 and the composition for encapsulation may include: about 10 wt % to about 70 wt % of the (A) non-silicon-based di(meth)acrylate; about 20 wt % to about 70 wt % of the (B) silicon-based di(meth)acrylate; about 5 wt % to about 40 wt % of the (C) mono(meth)acrylate; and about 1 wt % to about 10 wt % of the (D) initiator, based on the total weight of (A), (B), (C) and (D).

The composition for encapsulation of an organic light emitting diode according to this embodiment can suppress change in viscosity at room temperature. The composition for encapsulation according to this embodiment of the present invention can exhibit higher light transmittance, higher photocuring rate and lower plasma etching rate than compositions for encapsulation, which do not include the heat stabilizer. The composition for encapsulation of an organic light emitting diode according to this embodiment is the same as that according to the above embodiment excluding the heat stabilizer. Therefore, only the heat stabilizer will be described in detail hereinafter.

The (E) heat stabilizer is included in the composition for encapsulation to suppress change in viscosity at room temperature, and may include any typical heat stabilizers. The (E) heat stabilizer may be a sterically hindered phenolic heat stabilizer.

Specifically, the (E) heat stabilizer may include at least one of pentaerythritol tetrakis[3-(3,5-di-tert-butyl-4-hydroxyphenyl)propionate], stearyl-3-(3,5-di-t-butyl-4-hydroxyphenyl)propionate, 1,3,5-tris(2,6-dimethyl-3-hydroxy-4-t-butylbenzypisocyanurate, 1,3,5-tris(3,5-di-t-butyl-4-hydroxybenzyl)isocyanurate, 1,3,5-tris(2-hydroxyethyl)isocyanurate, pentaerythritol tetrakis[3-(3,5-di-t-butylhydroxyphenyl)propionate], and tris(4-t-butyl-3-hydroxy-2,6-dimethylbenzyl)isocyanurate, without being limited thereto.

The (E) heat stabilizer may be present in an amount of about 2,000 ppm or less, specifically about 0.01 ppm to about 2,000 ppm, more specifically about 100 ppm to about 800 ppm, based on the total weight of (A), (B), (C) and (D). Within this range, the heat stabilizer can further improve storage stability and processability of the composition for encapsulation in a liquid state.

An organic light emitting diode display according to the present invention may include an organic barrier layer formed of the composition for encapsulation of an organic light emitting diode according to the embodiments of the invention. Specifically, the organic light emitting diode display may include an organic light emitting diode, and a barrier stack formed on the organic light emitting diode and including an inorganic barrier layer and an organic barrier layer, wherein the organic barrier layer may be formed of the composition for encapsulation of an organic light emitting diode according to the embodiments of the present invention. As a result, the organic light emitting diode display can exhibit excellent reliability.

In the organic light emitting diode display according to the present invention, the organic barrier layer may be formed of the composition for encapsulation of an organic light emitting diode using inkjet printing or deposition.

Hereinafter, an organic light emitting diode display according to one embodiment of the present invention will be described in detail with reference to FIG. 1. FIG. 1 is a sectional view of an organic light emitting diode display according to one embodiment of the present invention.

Referring to FIG. 1, an organic light emitting diode display 100 according to one embodiment of the invention may include a substrate 10, an organic light emitting diode 20 formed on the substrate 10, and a barrier stack 30 which is formed on the organic light emitting diode 20 and includes an inorganic barrier layer 31 and an organic barrier layer 32, wherein the inorganic barrier layer 31 may be in contact with the organic light emitting diode 20, and the organic barrier layer 32 may be formed of the composition for encapsulation of an organic light emitting diode according to the embodiments of the invention.

The substrate 10 may be any substrate so long as an organic light emitting diode can be formed on the substrate. For example, the substrate 10 may be formed of a material, such as transparent glass, a plastic sheet, a silicon or metal substrate, and the like.

The organic light emitting diode 20 is an organic light emitting diode typically used in organic light emitting diode displays, and may include a first electrode, a second electrode and an organic light emitting film formed between the first and second electrodes, although not shown in FIG. 1. The organic light emitting film may have a structure wherein a hole injection layer, a hole transport layer, a light emitting layer, an electron transport layer, and an electron injection layer are sequentially stacked, without being limited thereto.

The barrier stack 30 includes the organic barrier layer and the inorganic barrier layer. Since each of the organic and inorganic barrier layers includes different components, each of the organic and inorganic barrier layers can realize a function of encapsulating organic light emitting diodes.

The inorganic barrier layer includes different components from those of the organic barrier layer and thus can supplement effects of the organic barrier layer. The inorganic barrier layer may be formed of an inorganic material exhibiting excellent light transmittance and excellent moisture and/or oxygen barrier properties. For example, the inorganic barrier layer may include at least one selected from the group consisting of metals, nonmetals, intermetallic compounds or alloys, inter-nonmetallic compounds or alloys, oxides of metals or nonmetals, fluorides of metals or nonmetals, nitrides of metals or nonmetals, carbides of metals or nonmetals, oxynitrides of metals or nonmetals, borides of metals or nonmetals, oxyborides of metals or nonmetals, silicides of metals or nonmetals, and combinations thereof. The metals or nonmetals may include silicon (Si), aluminum (Al), selenium (Se), zinc (Zn), antimony (Sb), indium (In), germanium (Ge), tin (Sn), bismuth (Bi), transition metals, and lanthanide metals, without being limited thereto. Specifically, the inorganic barrier layer may include silicon oxide ($SiO_x$), silicon nitride ($SiN_x$), silicon oxynitride ($Si-O_xN_y$), ZnSe, ZnO, $Sb_2O_3$, $AlO_x$ including $Al_2O_3$, $In_2O_3$, or $SnO_2$.

The inorganic barrier layer may be deposited by a plasma process or a vacuum process, for example, sputtering, chemical vapor deposition, plasma enhanced chemical vapor deposition, evaporation, sublimation, electron cyclotron resonance-plasma vapor deposition, or combinations thereof.

The organic and inorganic barrier layers are alternately deposited, thereby securing smoothing properties of the inorganic barrier layer, while preventing defects of one inorganic barrier layer from spreading to other inorganic barrier layers.

The organic barrier layer may be formed by deposition, inkjet printing, screen printing, spin coating, blade coating, curing of the composition for encapsulation according to the embodiments of the invention, or combinations thereof. For example, the composition for encapsulation may be coated to a thickness from about 1 μm to about 50 μm, followed by curing through irradiation at about 10 mW/cm$^2$ to about 500 mW/cm$^2$ for about 1 second to about 100 seconds.

The barrier stack includes any number of organic and inorganic barrier layers. Combination of the organic and inorganic barrier layers may vary with a level of permeation resistance to oxygen, moisture, water vapor and/or chemicals. For example, the total number of organic and inorganic barrier layers may be 10 layers or less, for example, 2 layers to 7 layers. Specifically, the barrier stack may be formed in 7 layers in order of inorganic barrier layer/organic barrier layer/inorganic barrier layer/organic barrier layer/inorganic barrier layer/organic barrier layer/inorganic barrier layer.

In the barrier stack, the organic barrier layer and the inorganic barrier layer may be alternately deposited. This is because the aforementioned composition has an effect on the organic barrier layer due to the properties thereof. As a result, the organic and inorganic barrier layers can supplement or reinforce encapsulation of the member for the apparatus.

Figure 2:
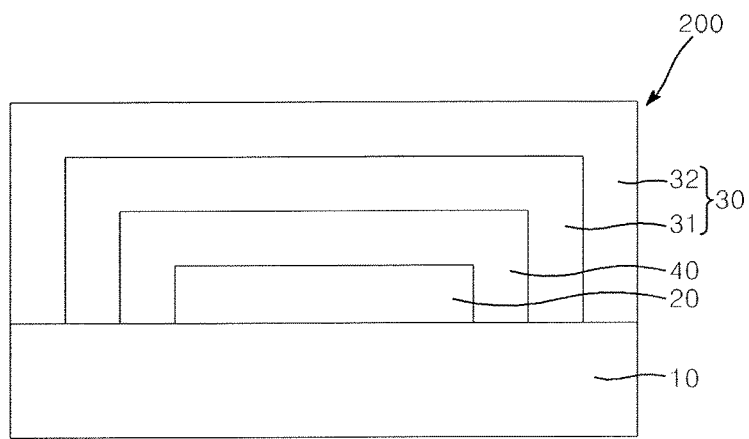
FIG. 2 is a sectional view of an organic light emitting diode display according to another embodiment of the present invention.

Hereinafter, an organic light emitting diode display according to another embodiment of the invention will be described in detail with reference to FIG. 2. FIG. 2 is a sectional view of an organic light emitting diode display according to another embodiment of the present invention.

Referring to FIG. 2, the organic light emitting diode display 200 according to this embodiment may include a substrate 10, an organic light emitting diode 20 formed on the substrate 10, and a barrier stack 30 formed on the organic light emitting diode 20 and including an inorganic barrier layer 31 and an organic barrier layer 32, wherein the inorganic barrier layer 31 encapsulates an internal space 40 accommodating the organic light emitting diode 20, and the organic barrier layer 32 may be formed of the composition for encapsulation of an organic light emitting diode according to the embodiments of the invention. The organic light emitting diode display according to this embodiment is substantially the same as that according to the above embodiment except that the inorganic barrier layer does not adjoin the organic light emitting diode.

Next, the present invention will be described in more detail with reference to some examples. It should be understood that these examples are provided for illustration only and are not to be construed in any way as limiting the present invention.

Preparative Example 1

In a 1000 ml flask provided with a cooling tube and a stirrer, 300 ml of ethyl acetate, 25 g of 3-phenyl-1,1,3,5,5-pentamethyltrisiloxane (Gelest Inc.) and 43 g of allyl alcohol (Daejung Chemicals and Materials Co., Ltd.) were placed, followed by nitrogen purging for 30 minutes. Next, 72 ppm of Pt-on-carbon black powder (Aldrich GmbH) was added to the mixture, followed by heating the flask to 80° C., and then, the mixture was stirred for 4 hours. Residual solvent was removed by distillation. 71.5 g of the obtained compound to 300 ml of dichloromethane and 39 g of triethylamine were added, followed by slow addition of 34.3 g of acryloyl chloride with stirring the composition at 0° C. The residual solvent was removed by distillation, thereby obtaining a monomer (molecular weight: 522.85 g/mol) represented by Formula 3 and having a purity of 97% as determined by HPLC. (1H NMR: δ7.61, m, 3H; δ7.12, m, 2H; δ6.25, d, 2H; δ6.02, dd, 2H; δ5.82, t, 1H; δ5.59, d, 2H; δ3.87, m, 4H; δ1.54, m, 4H; δ0.58, m, 4H; δ0.02, m, 15H)

<Formula 3>

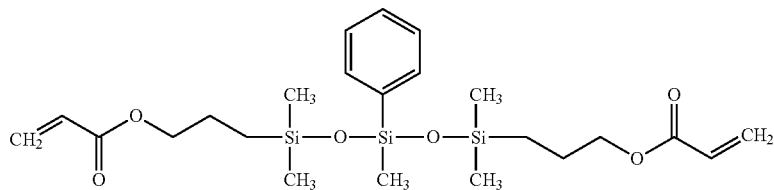

Preparative Example 2

A monomer (molecular weight: 584.92 g/mol) represented by Formula 4 was prepared in the same manner as in Preparative Example 1 except that 21 g of 3,3-diphenyl-1,1,5,5-tetramethyltrisiloxane was used instead of 25 g of 3-phenyl-1,1,3,5,5-pentamethyltrisiloxane and that 30.2 g of methacryloyl chloride was used instead of 34.3 g of acryloyl chloride. The obtained monomer had a purity of 96% as determined by HPLC. (1H NMR: δ7.52, m, 6H; δ7.42, m, 4H; δ6.25, d, 2H; δ6.02, dd, 2H; δ5.82, t, 1H; δ5.59, d, 2H; δ3.86, m, 4H; δ1.52, m, 4H; δ0.58, m, 4H; δ0.04, m, 12H)

Details of components used in Examples and Comparative Examples were as follows.

(A) Non-silicon-based di(meth)acrylate: (A1) 1,12-dodecanediol dimethacrylate (Sartomer Co., Ltd.), (A2) 1,10-decanediol dimethacrylate (Shin Nakamura Chemical Co., Ltd.).

(B) Silicon-based di(meth)acrylate: (B1) monomer of Preparative Example 1, (B2) monomer of Preparative Example 2, (B3) monomer of Preparative Example 3.

<Formula 4>

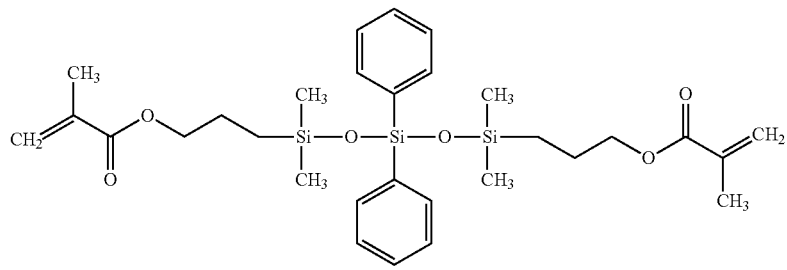

Preparative Example 3

A monomer (molecular weight: 646.99 g/mol) represented by Formula 5 was prepared in the same manner as in Preparative Example 1 except that 21 g of 3,3-diphenyl-1,1,5,5-tetramethyltrisiloxane was used instead of 25 g of 3-phenyl-1,1,3,5,5-pentamethyltrisiloxane. The obtained monomer had a purity of 94% as determined by HPLC. (1H NMR: δ7.61, m, 6H; δ7.12, m, 4H; δ6.25, d, 2H; δ6.02, dd, 2H; δ5.82, t, 2H; δ3.87, m, 4H; δ1.54, m, 4H; δ0.58, m, 4H; δ0.02, m, 12H)

(C) Mono(meth)acrylate: (C1) HRI-07 (Daelim Chemical Co., Ltd.), (C2) benzyl methacrylate (TCI Co., Ltd.), (C3) lauryl acrylate (Aldrich GmbH).

(D) Initiator: Darocur TPO (BASF GmbH).

(E) Heat stabilizer: IRGANOX 1010 (BASF GmbH).

(F) Monomer represented by Formula 10 (X-22-164, Shin-Etsu Co., Ltd., molecular weight: 460.78 g/mol).

<Formula 5>

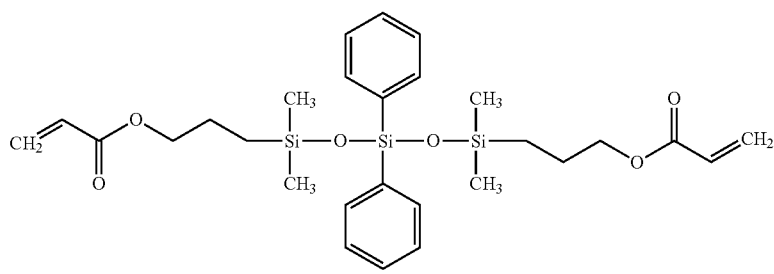

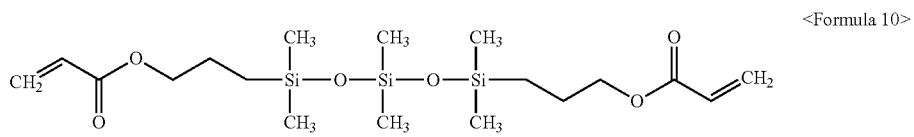 [SMILES: C=CC(=O)OCCC[Si](C)(C)O[Si](C)(C)O[Si](C)(C)CCCOC(=O)C=C]

<Formula 10>

Example 1

47.8 parts by weight of (A1), 28.7 parts by weight of (B1), 19.2 parts by weight of (C1) and 4.3 parts by weight of (D) were placed in a 125 ml brown polypropylene bottle, followed by mixing at room temperature for 3 hours using a shaker, thereby preparing a composition for encapsulation (viscosity at 25° C.: 21 cPs).

Examples 2 to 13 and Comparative Examples 1 to 4

A composition for encapsulation was prepared in the same manner as in Example 1 except that kinds and/or amounts of (A), (B), (C), (D) and (E) were changed as listed in Table 1 (unit: parts by weight).

Comparative Example 5

A composition for encapsulation was prepared in the same manner as in Example 1 except that 28.7 parts by weight of the (F) monomer was used instead of 28.7 parts by weight of the (B1) monomer of Preparative Example 1.

Each of the compositions for encapsulation prepared in Examples and Comparative Examples was evaluated as to properties as listed in Table 1. Results are shown in Tables 1 and 2.

TABLE 1

| | | Example | | | | | | | | | | | | |
|---|---|---|---|---|---|---|---|---|---|---|---|---|---|---|
| | | 1 | 2 | 3 | 4 | 5 | 6 | 7 | 8 | 9 | 10 | 11 | 12 | 13 |
| A | A1 | 47.8 | 47.8 | 38.8 | 38.8 | 47.8 | 48.5 | 38.25 | 38.8 | — | — | — | 47.8 | 47.8 |
| | A2 | — | — | — | — | — | — | — | — | 38.3 | 38.3 | 38.3 | — | — |
| B | B1 | 28.7 | 28.7 | 38.8 | 29.1 | — | — | — | — | 28.7 | — | — | — | — |
| | B2 | — | — | — | — | 28.7 | 29.1 | 38.25 | 29.1 | — | 28.7 | — | 28.7 | — |
| | B3 | — | — | — | — | — | — | — | — | — | — | 28.7 | — | 40.2 |
| C | C1 | 19.2 | 19.2 | 19.5 | 29.1 | 19.2 | 19.5 | 19.2 | 29.1 | 28.7 | 28.7 | 28.7 | — | — |
| | C2 | — | — | — | — | — | — | — | — | — | — | — | — | — |
| | C3 | — | — | — | — | — | — | — | — | — | — | — | 19.2 | 7.7 |
| | D | 4.3 | 4.3 | 2.9 | 3.0 | 4.3 | 2.9 | 4.3 | 3.0 | 4.3 | 4.3 | 4.3 | 4.3 | 4.3 |
| | E (ppm) | — | 750 | 750 | 750 | 750 | 750 | 750 | 750 | 750 | 750 | 750 | 750 | 750 |
| | F | — | — | — | — | — | — | — | — | — | — | — | — | — |
| | Photocuring rate (%) | 94.7 | 95.7 | 95.9 | 94.2 | 95.4 | 95.4 | 96.2 | 95.2 | 96.4 | 95.2 | 94.7 | 95.3 | 96.6 |
| | Light transmittance (%) | 93.5 | 93.7 | 93.8 | 94.6 | 94.2 | 94.2 | 94.6 | 94.4 | 95.2 | 96.1 | 95.8 | 94.8 | 95.2 |
| | Plasma etching rate (%) | 11.5 | 11.5 | 11.1 | 10.9 | 7.5 | 7.6 | 7.3 | 7.2 | 9.8 | 6.5 | 6.8 | 15.8 | 14.2 |

TABLE 2

| | | Comparative Example | | | | |
|---|---|---|---|---|---|---|
| | | 1 | 2 | 3 | 4 | 5 |
| A | A1 | 76.7 | 67.0 | 67.0 | 67.0 | 47.8 |
| | A2 | — | — | — | — | — |
| B | B1 | 16 | 28.7 | — | — | — |
| | B2 | — | — | — | — | — |
| | B3 | — | — | — | — | — |
| C | C1 | 3 | — | — | — | 19.2 |
| | C2 | — | — | 28.7 | — | — |
| | C3 | — | — | — | 28.7 | — |
| | D | 4.3 | 4.3 | 4.3 | 4.3 | 4.3 |
| | E (ppm) | — | 750 | 750 | 750 | — |
| | F | — | — | — | — | 28.7 |
| | Photocuring rate (%) | 92.5 | 94.2 | 93.5 | 92.4 | 89.5 |
| | Light transmittance (%) | 91.5 | 90.4 | 87.5 | 86.5 | 91.8 |
| | Plasma etching rate (%) | 23.5 | 22.1 | 32.5 | 38.7 | 25.5 |

As shown in Table 1, the compositions for encapsulation of an organic light emitting diode according to the present invention could realize an organic barrier layer exhibiting high photocuring rate, high light transmittance, and low plasma etching rate.

Conversely, as shown in Table 2, the composition for encapsulation of Comparative Example 1, which included (A), (B) and (C) in amounts outside the range according to the present invention, had a problem of high plasma etching rate. In addition, the compositions for encapsulation of Comparative Examples 2 to 4, which did not include any one of (B) and (C), also had a problem of high plasma etching rate. Further, the composition for encapsulation of Comparative Example 5, which included the silicon-based di(meth)acrylate not containing an aryl group, also had a problem of high plasma etching rate.

<Evaluation of Properties>

(1) Photocuring rate: The composition for encapsulation was measured as to the intensity of absorption peaks in the vicinity of 1635 cm$^{-1}$ (C=C) and 1720 cm$^{-1}$ (C=O) using FT-IR (NICOLET 4700, Thermo Co., Ltd.). The composition was coated onto a glass substrate using a spray, followed by UV curing through UV irradiation at 100 mW/cm² for 10 seconds, thereby obtaining a specimen having a size of 20 cm×20 cm×3 μm (width×length×thickness). Then, the intensity of absorption peaks of the cured film was measured in the vicinity of 1635 cm⁻¹ (C=C) and 1720 cm⁻¹ (C=O) using FT-IR (NICOLET 4700, Thermo Co., Ltd.). Photocuring rate was calculated by Equation 1:

Photocuring rate (%)=|1−(A/B)|×100    <Equation 1>

(where A is a ratio of intensity of an absorption peak in the vicinity of 1635 cm⁻¹ to intensity of an absorption peak in the vicinity of 1720 cm⁻¹ for the cured film; and B is a ratio of intensity of an absorption peak in the vicinity of 1635 cm⁻¹ to intensity of an absorption peak in the vicinity of 1720 cm⁻¹ for the composition for encapsulation).

(2) Light transmittance: The composition for encapsulation was subjected to UV curing under N₂ to form a 10 μm thick film. Next, light transmittance in the visible light range of 550 nm was measured on the film using a Lambda 950 (Perkin Elmer Co., Ltd.).

(3) Plasma etching rate: The composition for encapsulation was coated to a predetermined thickness and photocured to form the organic barrier layer, followed by measuring the initial coating height (T1, 1 μm to 10 μm) of the organic barrier layer. The organic barrier layer was subjected to plasma treatment under conditions of ICP power: 2500 W, RF power: 300 W, DC bias: 200 V, Ar flow: 50 sccm, etching time: 1 min, and pressure: 10 mtorr, followed by measuring the height (T2, unit: μm) of the organic barrier layer. The plasma etching rate of the organic barrier layer was calculated by Equation 2:

Plasma etching rate of organic barrier layer (%)={(T1−T2)/T1}×100    <Equation 2>

It should be understood that various modifications, changes, alterations, and equivalent embodiments can be made by those skilled in the art without departing from the spirit and scope of the invention.

The invention claimed is:

1. A composition for encapsulation of an organic light emitting diode, the composition comprising:
about 10 wt % to about 70 wt % of (A) a non-silicon-based di(meth)acrylate;
about 20 wt % to about 70 wt % of (B) a silicon-based di(meth)acrylate;
about 5 wt % to about 40 wt % of (C) a mono(meth)acrylate; and
about 1 wt % to about 10 wt % of (D) an initiator, based on the total weight of (A), (B), (C) and (D),
wherein the (B) silicon-based di(meth)acrylate is represented by Formula 1:

<Formula 1>

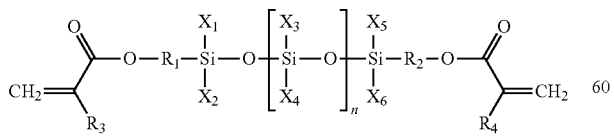

wherein, in Formula 1,
$R_1$ and $R_2$ are each independently a single bond, a substituted or unsubstituted $C_1$ to $C_{20}$ alkylene group, a substituted or unsubstituted $C_1$ to $C_{30}$ alkylene ether group, *—N(R')—(R")—* (* represents a binding site for an element, R' is hydrogen or a substituted or unsubstituted $C_1$ to $C_{30}$ alkyl group, and R" is a substituted or unsubstituted $C_1$ to $C_{20}$ alkylene group), a substituted or unsubstituted $C_6$ to $C_{30}$ arylene group, a substituted or unsubstituted $C_7$ to $C_{30}$ arylalkylene group, or *—(R')—O—** (* represents a binding site for O in Formula 1, ** represents a binding site for Si in Formula 1, and R' is a substituted or unsubstituted $C_1$ to $C_{30}$ alkylene group);

$X_1$, $X_2$, $X_3$, $X_4$, $X_5$ and $X_6$ are each independently hydrogen, a hydroxyl group, a halogen, a cyano group, a substituted or unsubstituted $C_1$ to $C_{30}$ alkyl group, a substituted or unsubstituted $C_1$ to $C_{30}$ heterocycloalkyl group, a substituted or unsubstituted $C_3$ to $C_{30}$ cycloalkyl group, a substituted or unsubstituted $C_1$ to $C_{30}$ alkyl ether group, *—N(R')—(R")—* (* represents a binding site for an element, and R' and R" are each independently hydrogen or a substituted or unsubstituted $C_1$ to $C_{30}$ alkyl group), a substituted or unsubstituted $C_1$ to $C_{30}$ alkyl sulfide group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group;

at least one of $X_1$, $X_2$, $X_3$, $X_4$, $X_5$ and $X_6$ is a substituted or unsubstituted $C_6$ to $C_{30}$ aryl group, or a substituted or unsubstituted $C_2$ to $C_{30}$ heteroaryl group;

$R_3$ and $R_4$ are each independently hydrogen or a methyl group; and n is an integer from 0 to 30, or ranges on average from 0 to 30.

2. The composition for encapsulation of an organic light emitting diode according to claim 1, comprising:
about 10 wt % to about 50 wt % of the (A) non-silicon-based di(meth)acrylate;
about 20 wt % to about 70 wt % of the (B) silicon-based di(meth)acrylate;
about 5 wt % to about 40 wt % of the (C) mono(meth)acrylate; and
about 1 wt % to about 10 wt % of the (D) initiator, based on the total weight of (A), (B), (C) and (D).

3. The composition for encapsulation of an organic light emitting diode according to claim 1, wherein:
$R_1$ and $R_2$ are each independently a single bond, a substituted or unsubstituted $C_1$ to $C_{20}$ alkylene group, or a substituted or unsubstituted $C_1$ to $C_{30}$ alkylene ether group;

$X_1$, $X_2$, $X_3$, $X_4$, $X_5$ and $X_6$ are each independently hydrogen, a substituted or unsubstituted $C_1$ to $C_{30}$ alkyl group, a substituted or unsubstituted $C_3$ to $C_{30}$ cycloalkyl group, a substituted or unsubstituted $C_1$ to $C_{30}$ alkyl ether group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group; and at least one of $X_1$, $X_2$, $X_3$, $X_4$, $X_5$ and $X_6$ is a substituted or unsubstituted $C_6$ to $C_{30}$ aryl group.

4. The composition for encapsulation of an organic light emitting diode according to claim 1, wherein the (B) silicon-based di(meth)acrylate is represented by any one of Formulae 3 to 8:

<Formula 3>
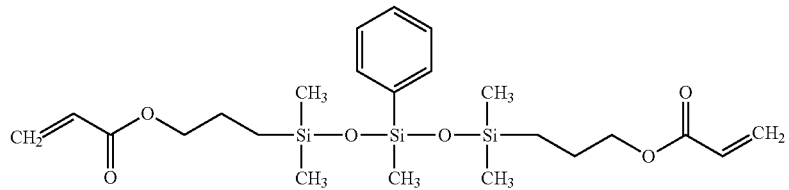
<Formula 4>
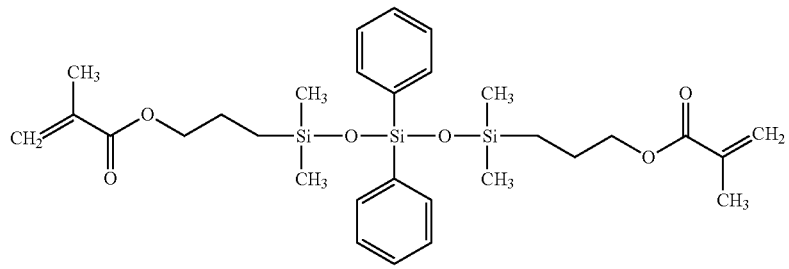
<Formula 5>
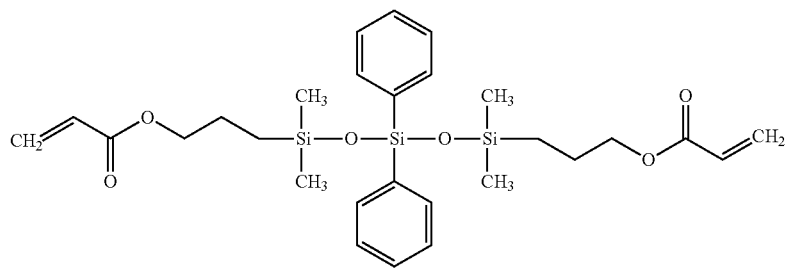
<Formula 6>
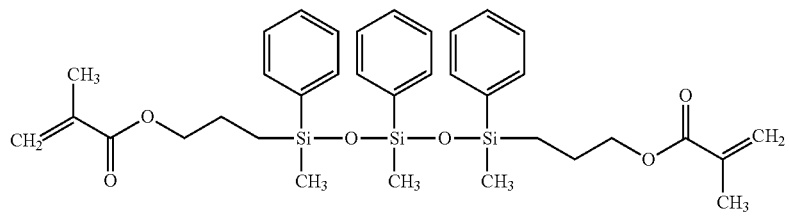
<Formula 7>
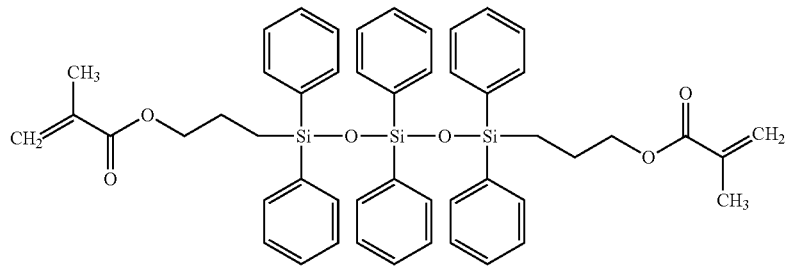
<Formula 8>
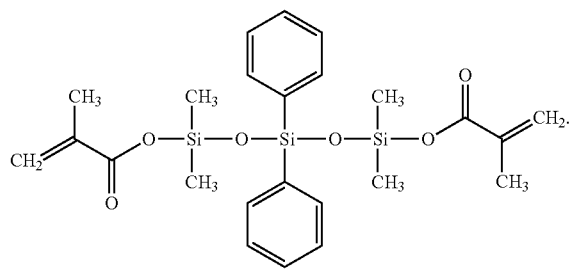
5. The composition for encapsulation of an organic light emitting diode according to claim 1, wherein the (A) non-silicon-based di(meth)acrylate is represented by Formula 2:

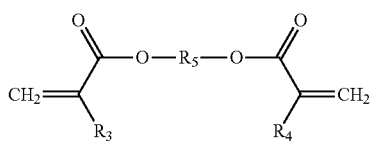
<Formula 2> wherein, in Formula 2,
$R_3$ and $R_4$ are each independently hydrogen or a methyl group; and
$R_5$ is a substituted or unsubstituted $C_1$ to $C_{20}$ alkylene group.

6. The composition for encapsulation of an organic light emitting diode according to claim 1, wherein the (C) mono (meth)acrylate is a non-silicon-based mono(meth)acrylate.

7. The composition for encapsulation of an organic light emitting diode according to claim 1, wherein the (C) mono (meth)acrylate includes an aromatic mono(meth)acrylate.

8. The composition for encapsulation of an organic light emitting diode according to claim 1, wherein the (C) mono (meth)acrylate includes a non-aromatic mono(meth)acrylate.

9. The composition for encapsulation of an organic light emitting diode according to claim 1, further comprising a heat stabilizer.

10. The composition for encapsulation of an organic light emitting diode according to claim 9, wherein the heat stabilizer is present in an amount of about 0.01 ppm to about 2,000 ppm based on the total weight of (A), (B), (C) and (D).

11. The composition for encapsulation of an organic light emitting diode according to claim 9, wherein:
the (A) non-silicon-based di(meth)acrylate includes a C1 to C20 alkylene group-containing di(meth)acrylate;
the (B) silicon-based di(meth)acrylate is represented by any one of Formulae 3 to 8:

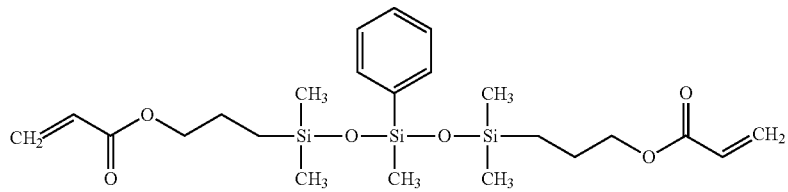
<Formula 3>

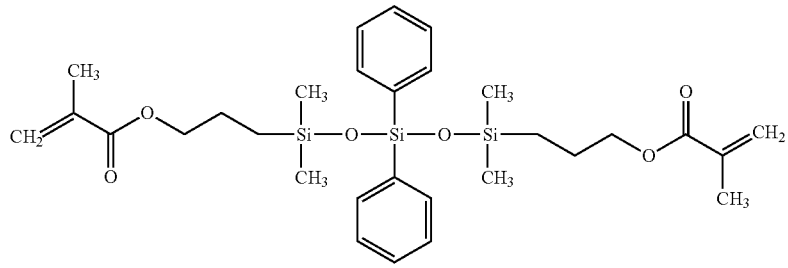
<Formula 4>

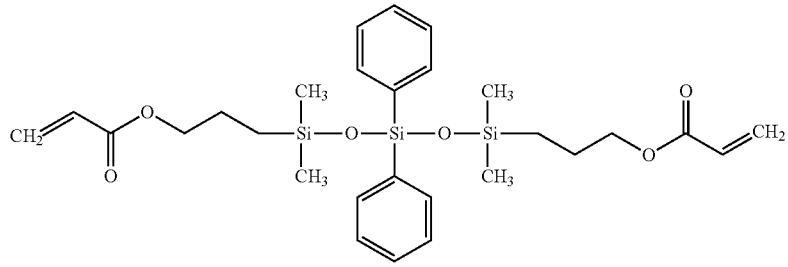
<Formula 5>

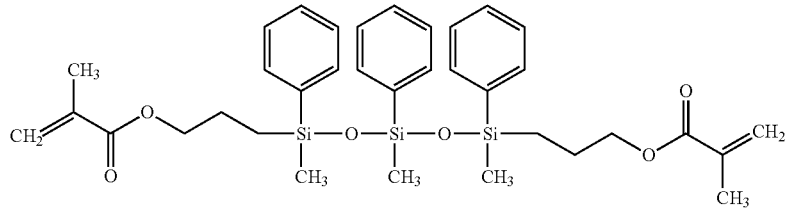
<Formula 6>

-continued

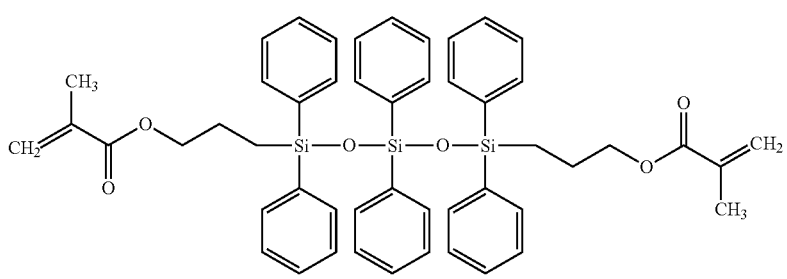
<Formula 7>

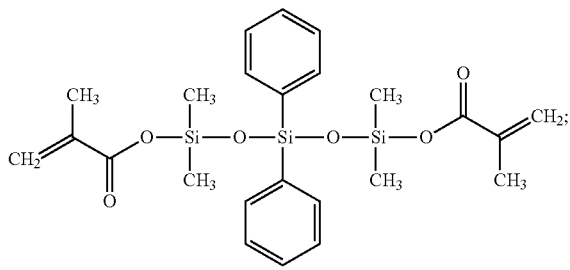
<Formula 8> the (C) mono(meth)acrylate is represented by Formula 9:

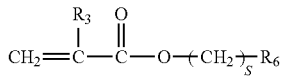
<Formula 9> wherein, in Formula 9, $R_3$ is hydrogen or a methyl group; s is an integer from 0 to 10; and $R_6$ is a substituted or unsubstituted $C_6$ to $C_{50}$ aryl group or a substituted or unsubstituted $C_6$ to $C_{50}$ aryloxy group; and
the (D) initiator includes a phosphorus initiator.

12. The composition for encapsulation of an organic light emitting diode according to claim 1, wherein the composition has a viscosity at 25° C.±2° C. of about 5 cPs to about 50 cPs.

13. An organic light emitting diode display, comprising:
an organic light emitting diode; and
a barrier stack formed on the organic light emitting diode and including an inorganic barrier layer and an organic barrier layer,
wherein the organic barrier layer is formed of the composition for encapsulation of an organic light emitting diode according to claim 1.

14. The display according to claim 13, wherein the organic barrier layer is formed of the composition for encapsulation of an organic light emitting diode using inkjet printing or deposition.

* * * * *